(12) United States Patent
Kim et al.

(10) Patent No.: US 10,608,193 B2
(45) Date of Patent: Mar. 31, 2020

(54) DISPLAY DEVICE HAVING REDUCED STRESS OF CONDUCTIVE LAYERS IN BENDING AREA

(71) Applicant: SAMSUNG DISPLAY CO., LTD., Yongin-si, Gyeonggi-do (KR)

(72) Inventors: Minsang Kim, Yongin-si (KR); Seungwook Kwon, Yongin-si (KR); Ohjune Kwon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/122,972

(22) Filed: Sep. 6, 2018

(65) Prior Publication Data

US 2019/0081257 A1   Mar. 14, 2019

(30) Foreign Application Priority Data

Sep. 8, 2017   (KR) .................. 10-2017-0115129

(51) Int. Cl.
*H01L 51/00*   (2006.01)
*H01L 27/32*   (2006.01)
*H01L 51/50*   (2006.01)
*H01L 51/10*   (2006.01)
(Continued)

(52) U.S. Cl.
CPC ........ *H01L 51/0097* (2013.01); *H01L 27/124* (2013.01); *H01L 27/1218* (2013.01); *H01L 27/1248* (2013.01); *H01L 27/3246* (2013.01); *H01L 27/3248* (2013.01); *H01L 27/3258* (2013.01); *H01L 27/3276* (2013.01); *H01L 51/105* (2013.01); *H01L 51/5056* (2013.01); *H01L 51/5072* (2013.01); *H01L 51/5092* (2013.01); *H01L 51/56* (2013.01); *H01L 2251/5338* (2013.01)

(58) Field of Classification Search
CPC . H01L 51/56; H01L 51/5012; H01L 51/0097; H01L 27/3246; H01L 51/5072
USPC .......................................................... 257/40
See application file for complete search history.

(56) References Cited

U.S. PATENT DOCUMENTS

2014/0217397 A1    8/2014  Kwak et al.
2017/0294502 A1*  10/2017  Ka ..................... H01L 27/3248
2017/0317299 A1*  11/2017  Choi .................. H01L 27/3262

FOREIGN PATENT DOCUMENTS

KR    1020140087499 A    7/2014
KR    1020140099139 A    8/2014
KR    1020140103025 A    8/2014
(Continued)

*Primary Examiner* — Andy Huynh
(74) *Attorney, Agent, or Firm* — Cantor Colburn LLP

(57) ABSTRACT

A display device includes: a substrate including a bending area at least partially bent around a bending axis extending in a first direction; a first organic layer on the substrate, where a plurality of first openings is defined in a portion of the first organic layer corresponding to the bending area; a first conductive layer on the portion of the first organic layer and covering at least a portion of the plurality of first openings; a second organic layer on the first conductive layer, where a plurality of second openings is defined in the second organic layer; and a second conductive layer on the second organic layer, covering at least a portion of the plurality of second openings, and electrically connected to the first conductive layer through the plurality of second openings.

20 Claims, 6 Drawing Sheets

(51) Int. Cl.
*H01L 51/56* (2006.01)
*H01L 27/12* (2006.01)

(56) References Cited

FOREIGN PATENT DOCUMENTS

KR   1020160141357 A   12/2016
WO      2014126403 A1    8/2014

* cited by examiner

DISPLAY DEVICE HAVING REDUCED STRESS OF CONDUCTIVE LAYERS IN BENDING AREA

This application claims priority to Korean Patent Application No. 10-2017-0115129, filed on Sep. 8, 2017, and all the benefits accruing therefrom under 35 U.S.C. § 119, the content of which in its entirety is herein incorporated by reference.

BACKGROUND

1. Field

One or more exemplary embodiments relate to a display device, and more particularly, to a display device which has a long lifespan and minimizes occurrences of defects, such as disconnection, during a manufacturing process.

2. Description of the Related Art

Generally, a display device has a display unit located on a substrate. In such a display device, it may be possible to improve the visibility of the display device at various angles or reduce the area of a non-display area by bending the display unit.

SUMMARY

In a display device including a bent display unit, defects may occur in a bent portion of the display unit while bending during a process of manufacturing the display device, or the lifespan thereof may be shortened.

One or more exemplary embodiments include a display device having a long lifespan and in which the occurrence of defects, such as disconnection, is effectively prevented during a manufacturing process.

According to one or more exemplary embodiments, a display device includes: a substrate including a bending area at least partially bent around a bending axis extending in a first direction; a first organic layer on the substrate, where a plurality of first openings is defined in a portion of the first organic corresponding to the bending area; a first conductive layer on the portion of the first organic layer and covering at least a portion of the plurality of first openings; a second organic layer on the first conductive layer, where a plurality of second openings is defined in the second organic layer; and a second conductive layer on the second organic layer, covering at least a portion of the plurality of second openings, and electrically connected to the first conductive layer through the plurality of second openings.

In an exemplary embodiment, the plurality of first openings may extend in the first direction.

In an exemplary embodiment, the plurality of second openings may extend in the first direction.

In an exemplary embodiment, the first conductive layer may contact at least a portion of the substrate through the plurality of first openings.

In an exemplary embodiment, the display device may further include: an inorganic film between the substrate and the first organic layer, where the first conductive layer may contact at least a portion of the inorganic film through the plurality of first openings.

In an exemplary embodiment, the plurality of first openings and the plurality of second openings may be alternately disposed with each other when viewed from a plan view in a thickness direction of the substrate.

In an exemplary embodiment, a plurality of first ridges may be defined between the plurality of first openings, and a plurality of second ridges may be defined between the plurality of second openings.

In an exemplary embodiment, the plurality of second ridges may be on the plurality of first openings.

In an exemplary embodiment, a planar shape of at least one of the first conductive layer and the second conductive layer on the bending area may have a serpentine shape.

In an exemplary embodiment, the display device may further include: a display device on the substrate, where the substrate may further include a first area and a second area which are opposite to each other with respect to the bending area, and the display device may be on the first area.

In an exemplary embodiment, the first organic layer and the substrate may be integrally formed as a single unitary and indivisible unit.

In an exemplary embodiment, the display device may further include: a third organic layer on the second conductive layer, where a plurality of third openings is defined in the third organic layer; and a third conductive layer on the third organic layer and electrically connected to the second conductive layer through the plurality of third openings.

In an exemplary embodiment, the plurality of third openings may extend in the first direction.

In an exemplary embodiment, the plurality of second openings and the plurality of third openings may be alternately disposed with each other when viewed from a plan view in a thickness direction of the substrate.

In an exemplary embodiment, a plurality of third ridges may be defined between the plurality of third openings, and the plurality of third ridges may be arranged on the plurality of second openings.

In an exemplary embodiment, the first conductive layer, the second conductive layer and the third conductive layer may be electrically connected to one another.

In an exemplary embodiment, the first organic layer may have a first height, and the second organic layer may have a second height less than the first height.

In an exemplary embodiment, at least a portion of the first conductive layer may be exposed through the plurality of second openings.

According to one or more exemplary embodiments, a display device includes: a substrate including a first area, a second area spaced apart from the first area, and a bending area between the first area and the second area, where the bending area is bent around a bending axis extending in a first direction; a display device on the first area of the substrate; and a wiring portion on the bending area of the substrate. In such an embodiment, the wiring portion includes: a first organic layer on the substrate wherein the first organic layer includes a plurality of first ridges spaced apart from each other with a first interval and extending in the first direction; a first conductive layer on the first organic layer, a second organic layer on the first conductive layer, where the second organic layer includes a plurality of second ridges spaced apart from each other with a second interval and extending in the first direction, and a second conductive layer on the second organic layer and electrically connected to the first conductive layer through the second interval between the plurality of second ridges of the second organic layer.

According to one or more exemplary embodiments, a planar shape of at least one of the first conductive layer and the second conductive layer on the bending area may have a serpentine shape.

BRIEF DESCRIPTION OF THE DRAWINGS

These and/or other features of the invention will become apparent and more readily appreciated from the following description of exemplary embodiments, taken in conjunction with the accompanying drawings, in which.

DETAILED DESCRIPTION

Figure 1:
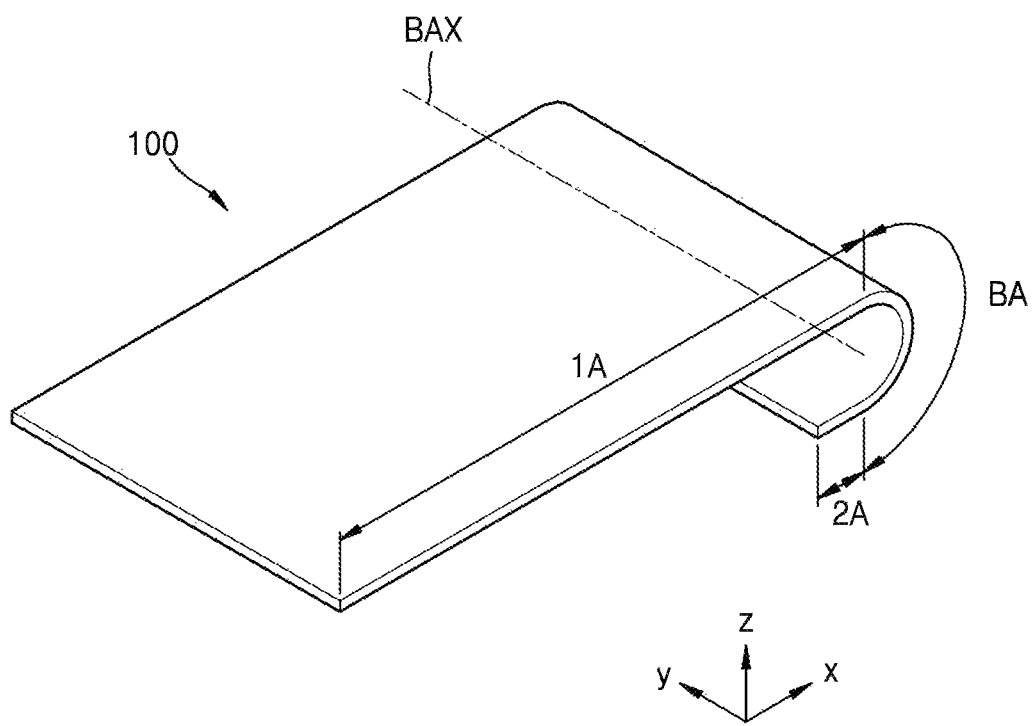
FIG. 1 is a perspective view of a portion of a display device according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

An x-axis, a y-axis and a z-axis are not limited to three axes of a rectangular coordinate system and may be interpreted in a broader sense. For example, the x-axis, the y-axis, and the z-axis may be perpendicular to one another or may represent different directions that are not perpendicular to one another.

All methods described herein can be performed in a suitable order unless otherwise indicated herein or otherwise clearly contradicted by context. When a certain embodiment may be implemented differently, a specific process order may be performed differently from the described order. For example, two consecutively described processes may be performed substantially at the same time or performed in an order opposite to the described order.

Hereinafter, exemplary embodiments of the invention will be described in detail with reference to the accompanying drawings.

Figure 2:
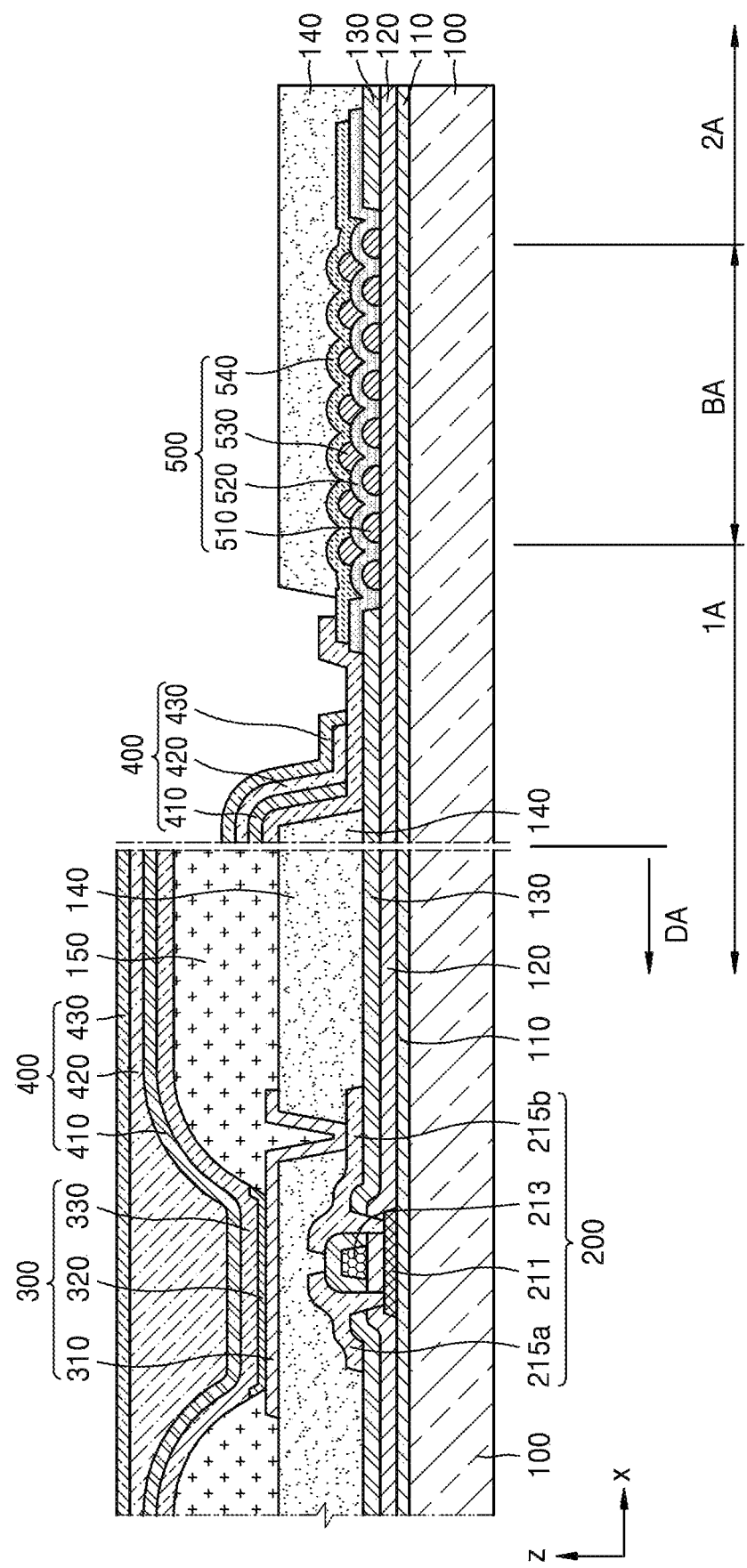
FIG. 2 is a cross-sectional view of a portion of the display device of FIG. 1.
Figure 3:
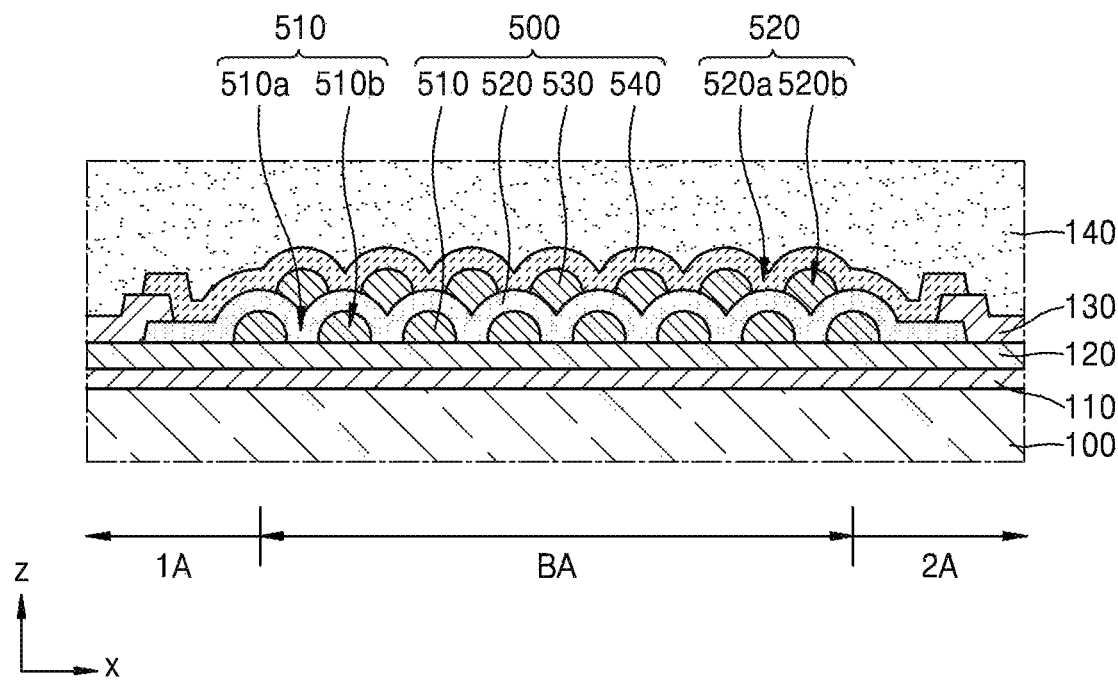
FIG. 3 is an enlarged cross-sectional view of a portion of the display device of FIG. 2.

FIG. 1 is a perspective view of a portion of a display device according to an exemplary embodiment, FIG. 2 is a cross-sectional view of a portion of the display device of FIG. 1, and FIG. 3 is an enlarged cross-sectional view of a portion of the display device of FIG. 2.

As shown in FIG. 1, an exemplary embodiment of the display device includes a substrate 100 having a bent portion. However, FIG. 2 shows the display device before bending, for convenience of illustration. For convenience of illustration, all cross-sectional views, plan views, and the like related to exemplary embodiments described hereinafter also show the display device before bending.

In an exemplary embodiment, as shown in FIGS. 1 and 2, the substrate 100 included in the display device includes a first area 1A, a second area 2A spaced apart from the first area 1A, and a bending area BA extending in a first direction (e.g., +y direction). The bending area BA is located between the first area 1A and the second area 2A in a second direction (e.g., +x direction) intersecting the first direction (or the +y direction). In such an embodiment, the first area 1A and the second area 2A may be substantially flat areas (or portions) of the display device. The substrate 100 is bent around a bending axis BAX extending in the first direction (or the +y direction) as shown in FIG. 1. The substrate 100 may include at least one of various flexible or bendable materials, for example, a polymer resin such as polyethersulphone ("PES"), polyacrylate ("PAR"), polyetherimide ("PEI"), polyethylene ("PEN"), polyethylene terephthalate ("PET"), polyphenylene sulfide ("PPS"), polyarylate ("PAR"), polyimide ("PI"), polycarbonate ("PC"), or cellulose acetate propionate ("CAP").

The first area 1A includes a display area DA. In an exemplary embodiment, as shown in FIG. 2, the first area 1A further includes a portion of a non-display area outside the display area DA. In such an embodiment, the second area 2A includes a non-display area.

The display area DA of the substrate 100 may include, in addition to a display device 300, a thin-film transistor ("TFT") 210 to which the display device 300 is electrically connected, as shown in FIG. 2. In an exemplary embodiment, as shown in FIG. 2, the display device 300 disposed in the display area DA is an organic light-emitting diode ("OLED"). In such an embodiment, where the OLED is electrically connected to the TFT 210, a pixel electrode 310 of the OLED is electrically connected to the TFT 210. Another TFT (not shown) may be arranged in a peripheral area outside the display area DA of the substrate 100. The TFT in the peripheral area may be a portion of a circuit unit for controlling an electrical signal, e.g., an electrical signal applied to the display area DA.

The TFT 210 may include a semiconductor layer 211 including amorphous silicon, polycrystalline silicon or an organic semiconductor material, a gate electrode 213, a source electrode 215a, and a drain electrode 215b. A gate insulating film 120 may be between the semiconductor layer 211 and the gate electrode 213 to insulate the semiconductor layer 211 from the gate electrode 213, and the gate insulating film 120 may include an inorganic material such as silicon oxide, silicon nitride and/or silicon oxynitride. An interlayer insulating layer 130 may be on the gate electrode 213, and the interlayer insulating layer 130 may include an inorganic material such as silicon oxide, silicon nitride and/or silicon oxynitride. The source electrode 215a and the drain electrode 215b may be on the interlayer insulating layer 130. In exemplary embodiments of the invention, any insulating film including an inorganic material may be provided or formed by chemical vapor deposition ("CVD") or atomic layer deposition ("ALD").

In an exemplary embodiment, as shown in FIG. 2, a buffer layer 110 may be between the TFT 210 and the substrate 100, and the buffer layer 110 may include an inorganic material such as silicon oxide, silicon nitride and/or silicon oxynitride. The buffer layer 110 may planarize or increase smoothness of an upper surface of elements therebelow or prevent or minimize impurities from the substrate 100 or the like from penetrating into the semiconductor layer 211 of the TFT 210.

A planarization layer 140 may be disposed above the TFT 210. In one exemplary embodiment, for example, as shown in FIG. 2, where the OLED is on the TFT 210, the planarization layer 140 may generally flatten an upper portion of a protective film covering the TFT 210. The planarization layer 140 may include an organic material such as acryl, benzocyclobutene ("BCB"), or hexamethyldisiloxane ("HMDSO"). Although the planarization layer 140 is shown as a monolayer in FIG. 2, the planarization layer 140 may have a multilayer structure or may be variously modified. In an exemplary embodiment, as shown in FIG. 2, an opening is defined in the planarization layer 140 outside the display area DA, and the planarization layer 140 of the display area DA and the planarization layer 140 of the second area 2A may be physically spaced apart from each other. In such an embodiment, impurities or the like is effectively prevented from penetrating from the outside to reach inside the display area DA through the planarization layer 140.

In the display area DA, an OLED may be located on the planarization layer 140, and the OLED includes the pixel electrode 310, an opposite electrode 330, and an intermediate layer 320 interposed therebetween and including an emission layer. In an exemplary embodiment, as shown in FIG. 2, the pixel electrode 310 is electrically connected to the TFT 210 by contacting with any one of the source electrode 215a and the drain electrode 215b through an opening defined in the planarization layer 140 or the like.

A pixel-defining layer 150 may be on the planarization layer 140. In such an embodiment, an opening corresponding to each of sub pixels, that is, an opening exposing at least a center portion of the pixel electrode 310, is defined in the pixel-defining layer 150 to define pixels. In such an embodiment, as shown in FIG. 2, the pixel-defining layer 150 prevents generation of an arc or the like at the edge of the pixel electrode 310 by increasing a distance between the edge of the pixel electrode 310 and the opposite electrode 330 over the pixel electrode 310. The pixel-defining layer 150 may include an organic material such as PI or HMDSO.

The intermediate layer 320 of the OLED may include a low-molecular material or a high-molecular material. In an exemplary embodiment, where the intermediate layer 320 includes a low molecular weight material, the intermediate layer 320 may have a single or a composite structure by stacking a hole injection layer ("HIL"), a hole transport layer ("HTL"), an emission layer ("EML"), an electron transport layer ("ETL"), and an electron injection layer ("EIL"). The intermediate layer 320 may include at least one of various organic materials, such as copper phthalocyanine ("CuPc"), N,N'-Di(naphthalene-1-yl)-N,N'-diphenyl-benzidine ("NPB"), and tris-8-hydroxyquinoline aluminum ("Alq3"). In an exemplary embodiment, such layers may be formed by an evaporation method.

In an exemplary embodiment, where the intermediate layer 320 includes a polymer material, the intermediate layer 320 may have a structure including an HTL and an EML. The HTL may include poly(3,4-ethylenedioxythiophene) ("PEDOT"), and the EML may include a high molecular weight material, such as poly-phenylenevinylene ("PPV") and polyfluorene. The intermediate layer 320 may be formed by using a screen printing method, an ink jet printing method, or a laser induced thermal imaging ("LITI") method.

The intermediate layer 320 is not limited thereto, but may be variously modified. In an exemplary embodiment, the intermediate layer 320 may include an integral layer over the entire plurality of the pixel electrodes 310 or may have layers patterned to correspond to each of the pixel electrodes 310.

The opposite electrode 330 may be disposed over the display area DA to cover the display area DA, as shown in FIG. 2. The opposite electrode 330 may be integrally formed as a single unitary and indivisible unit over a plurality of OLEDs to correspond to the plurality of the pixel electrodes 310.

In an exemplary embodiment, since the OLED may be easily damaged by moisture or oxygen from the outside, an encapsulation layer 400 may cover and protect the OLED. The encapsulation layer 400 may cover the display area DA and extend to the outside of the display area DA. The encapsulation layer 400 may include a first inorganic encapsulation layer 410, an organic encapsulation layer 420, and a second inorganic encapsulation layer 430, as shown in FIG. 2.

The first inorganic encapsulation layer 410 covers the opposite electrode 330 and may include $SiO_2$, SiNx, and/or SiON. In an alternative exemplary embodiment, another layer, for example, a capping layer may be interposed between the first inorganic encapsulation layer 410 and the opposite electrode 330. The shape of the first inorganic encapsulation layer 410 may correspond to the shape of a structure therebelow, and thus, as shown in FIG. 2, an upper surface thereof is not flat. The organic encapsulation layer 420 covers the first inorganic encapsulation layer 410. However, unlike the first inorganic encapsulation layer 410, an upper surface of the organic encapsulation layer 420 may be formed as generally flat. In such an embodiment, the upper surface of the organic encapsulation layer 420 corresponding to the display area DA may be substantially flat. The organic encapsulation layer 420 may include at least one selected from PET, PEN, PC, PI, PES, polyoxymethylene ("POM"), PAR, and HMDSO. The second inorganic encapsulation layer 430 covers the organic encapsulation layer 420 and may include $SiO_2$, SiNx, and/or SiON. The second inorganic encapsulation layer 430 may effectively prevent the organic encapsulation layer 420 from being exposed to the outside because the second inorganic encapsulation layer 430 contacts the edge of the first inorganic encapsulation layer 410 located outside the display area DA.

In such an embodiment, since the encapsulation layer 400 has a multilayer structure including the first inorganic encapsulation layer 410, the organic encapsulation layer 420 and the second inorganic encapsulation layer 430, although a crack occurs in the encapsulation layer 400, the crack may not be connected between the first inorganic encapsulation layer 410 and the organic encapsulation layer 420, or between the organic encapsulation layer 420 and the second inorganic encapsulation layer 430 through the multilayer structure. Accordingly, in such an embodiment, the formation of a penetration path of external moisture or oxygen into the display area DA may be effectively prevented or substantially minimized.

In an exemplary embodiment, although not shown, a polarizing plate (not shown) may be disposed on the encapsulation layer 400 by an optically clear adhesive ("OCA"). The polarizing plate may reduce the reflection of external light. In such an embodiment, when external light passes through the polarizing plate, is reflected by an upper surface of the opposite electrode 330, and then passes through the polarizing plate again, a phase of the external light may be changed as the external light passes through the polarizing plate twice. As a result, a phase of the reflected light is made different from the phase of the external light entering the polarizing plate, so that extinction interference is generated, and as a result, visibility may be improved by reducing the reflection of the external light. The OCA and the polarizing plate may cover, e.g., an opening of the planarization layer 140, as shown in FIG. 2. However, in an alternative exemplary embodiment of the display device, the polarizing plate may be omitted or replaced with other components if desired. In one alternative exemplary embodiment, for example, the polarizing plate may be omitted and the reflection of the external light may be reduced by using a black matrix and a color filter.

Referring to FIGS. 1 to 3, an exemplary embodiment of the display device may include a wiring portion 500 including a portion of a first organic layer 510 corresponding to the bending area BA and with a plurality of first openings 510a, a first conductive layer 520 on the portion of the first organic layer 510, a second organic layer 530 with a plurality of second openings 530a, and a second conductive layer 540 on the second organic layer 530.

The plurality of first openings 510a is defined in the portion of the first organic layer 510 to correspond to the bending area BA. The plurality of first openings 510a may extend in the first direction (or the +y direction) which is the same as a direction of the bending axis BAX. The plurality of first openings 510a may be defined by a plurality of first ridges 510b. In such an embodiment, the first ridges 510b may be between the plurality of first openings 510a. In such an embodiment, where the plurality of first openings 510a extend in the first direction (or the +y direction,) the plurality of first ridges 510b form a ridge line, and the plurality of first openings 510a form a valley.

In an exemplary embodiment, since the first organic layer 510 is on the gate insulating film 120, the plurality of first openings 510a of the first organic layer 510 may expose at least a portion of the gate insulating film 120. In such an embodiment, as shown in FIG. 3, at least a portion of the gate insulating film 120 may be in contact with the first conductive layer 520 on the first organic layer 510.

The first conductive layer 520 may be on the first organic layer 510. In an exemplary embodiment, the first conductive layer 520 may be on a same layer as the gate electrode 213 or may include a same material as that of the gate electrode 213.

The second organic layer 530 may be on the first conductive layer 520. The plurality of second openings 530a is defined in the second organic layer 530 to correspond to the bending area BA. The plurality of second openings 530a may extend in the first direction (or the +y direction) which is the same as the direction of the bending axis BAX. The plurality of second openings 530a may form a plurality of second ridges 530b. In such an embodiment, the second ridges 530b may be between the plurality of first openings 510a. In such an embodiment, where the plurality of second openings 530a extend in the first direction (or the +y direction), the plurality of second ridges 530b form a ridge line, and the plurality of second openings 530a form a valley.

In an exemplary embodiment, as shown in FIG. 3, the plurality of first ridges 510b and the plurality of second ridges 530b have a curved upper surface, but the present disclosure is not limited thereto. In an alternative exemplary embodiment, a cross section of the plurality of first ridges 510b and the plurality of second ridges 530b may have a substantially semicircular shape, or may have a rounded trapezoid shape or a rectangular shape.

In an exemplary embodiment, the plurality of first openings 510a of the first organic layer 510 and the plurality of second openings 530a of the second organic layer 530 may be alternately disposed with each other when viewed from a plan view in a thickness direction of the substrate 100 or the z direction. In such an embodiment, each of the plurality of second openings 530a may be on the plurality of first ridges 510b. In such an embodiment, the first conductive layer 520 is on the first organic layer 510, the first conductive layer 520 is disposed along a curvature of the first organic layer 510, and the plurality of second ridges 530b of the second organic layer 530 on the first conductive layer 520 are disposed in grooves of the first conductive layer 520 corresponding to the plurality of first openings 510a, such that the wiring portion 500 may have a compact structure.

The second conductive layer 540 may be on the second organic layer 530. In an exemplary embodiment, the second conductive layer 540 may be on a same layer as the source electrode 215a and/or the drain electrode 215b, or may include a same material as that of the source electrode 215a and/or the drain electrode 215b. The second conductive layer 540 may be in electrical contact with the first conductive layer 520 disposed below through the plurality of second openings 530a. In such an embodiment, the first conductive layer 520 and the second conductive layer 540 may be electrically connected to each other, such that the first conductive layer 520 and the second conductive layer 540 collectively define one wiring.

When at least a portion of the substrate 100 is bent to have the bending area BA, a stress is concentrated on wirings on the bending area BA, such that defects such as cracking or disconnection may occur in the wirings. In an exemplary embodiment of the display device, the wiring portion 500 on the bending area BA may include the first organic layer 510 with the plurality of first openings 510a under the first conductive layer 520, and the second organic layer 530 with the plurality of second openings 530a under the second conductive layer 540 to reduce a stress of the conductive layers. In such an embodiment, the wiring portion 500 may be defined by the first conductive layer 520 and the second conductive layer 540 which are electrically connected to each other on the bending area BA such that cracking or disconnection of the wiring portion 500 on the bending area Ba may be effectively prevented.

Figure 4:
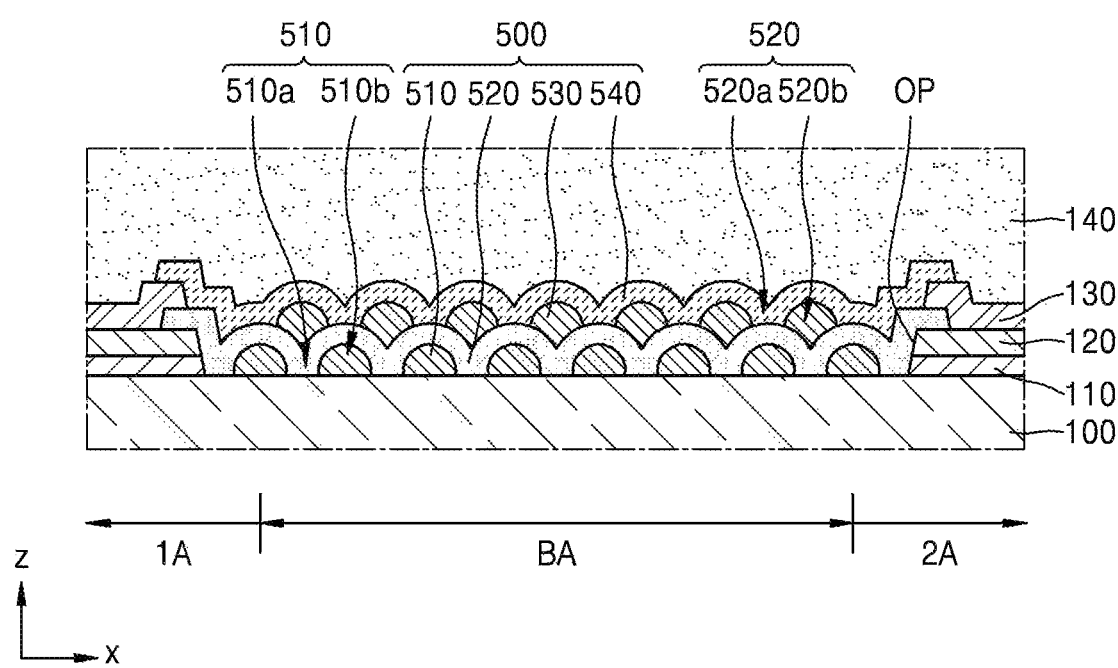
FIG. 4 is a cross-sectional view of a portion of a display device according to an alternative exemplary embodiment.

FIG. 4 is a cross-sectional view of a portion of a display device according to an alternative exemplary embodiment.

The display device shown in FIG. 4 is substantially the same as the display device shown in FIG. 3 except for the wiring portion 500 on the bending area BA. The same or like elements shown in FIG. 4 have been labeled with the same reference characters as used above to describe the exemplary embodiments of the display device shown in FIG. 3, and any repetitive detailed description thereof will hereinafter be omitted or simplified.

Referring to FIG. 4, an exemplary embodiment of the display device may include the wiring portion 500 including a portion of the first organic layer 510 corresponding to the bending area BA and with the plurality of first openings 510a, the first conductive layer 520 on the portion of the first organic layer 510, the second organic layer 530 with the plurality of second openings 530a, and the second conductive layer 540 on the second organic layer 530.

According to an exemplary embodiment, an open portion OP may be defined in an inorganic layer under the wiring portion 500. In one exemplary embodiment, for example, the open portion OP may be formed by removing an inorganic film at a portion corresponding to the bending area BA. A buffer layer 110 and the gate insulating film 120, which are arranged on the substrate 100, may be collectively referred to as the inorganic film, and the inorganic film on the bending area BA has a high probability of cracking when the substrate 100 is bent on the bending area BA. In such an embodiment, a portion of the inorganic film in the bending region BA may be removed to reduce the possibility of defects in the wiring portion 500 that may occur when cracks occurs in the inorganic film under the wiring portion 500. In an exemplary embodiment, as shown in FIG. 4, the open portion OP may be wider than a width of the bending area BA, but embodiments are not limited thereto.

In such an embodiment, the plurality of first openings 510a may be defined in the portion of the first organic layer 510 corresponding to the bending area BA. The plurality of first openings 510a may extend in the first direction (or the +y direction) which is the same as a direction of the bending axis BAX. The plurality of first openings 510a may form a plurality of first ridges 510b. The plurality of first openings 510a may expose at least a portion of the substrate 100. The first conductive layer 520 may be on the first organic layer 510, and a portion of the first conductive layer 520 may be in contact with the substrate 100 through the plurality of first openings 510a.

In such an embodiment, as described above with reference to FIG. 3, the second organic layer 530 having the plurality of second openings 530a may be on the first conductive layer 520 and the second conductive layer 540 may be on the second organic layer 530.

Figure 5:
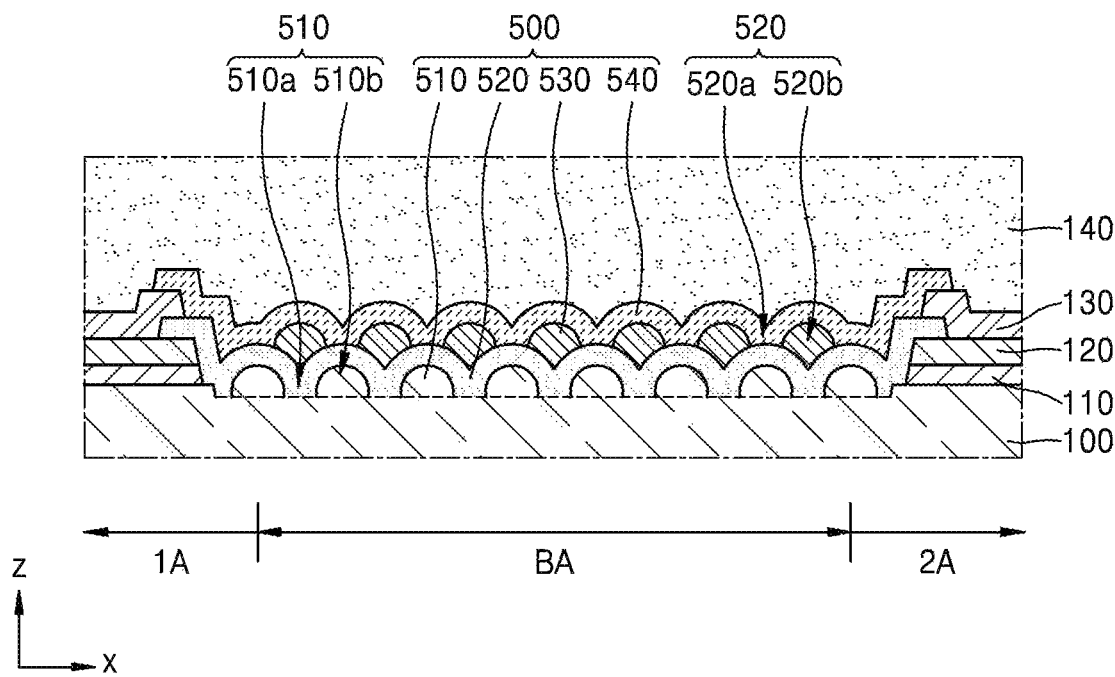
FIG. 5 is a cross-sectional view of a portion of a display device according to another alternative exemplary embodiment.

FIG. 5 is a cross-sectional view of a portion of a display device according to another exemplary embodiment.

The display device shown in FIG. 5 is substantially the same as the display device shown in FIG. 3 the wiring portion 500 on the bending area BA. The same or like elements shown in FIG. 5 have been labeled with the same reference characters as used above to describe the exemplary embodiments of the display device shown in FIG. 3, and any repetitive detailed description thereof will hereinafter be omitted or simplified.

Referring to FIG. 5, an exemplary embodiment of the display device may include the wiring portion 500 including a portion of the first organic layer 510 corresponding to the bending area BA and with the plurality of first openings 510a, the first conductive layer 520 on the portion of the first organic layer 510, the second organic layer 530 with the plurality of second openings 530a, and the second conductive layer 540 on the second organic layer 530.

In such an embodiment, the first organic layer 510 under the first conductive layer 520 may be integrally formed with the substrate 100. In such an embodiment, the first organic layer 510 may be defined by a portion of the substrate 100. The first organic layer 510 may form the plurality of first ridges 510b on the substrate 100 by patterning a portion of the substrate 100 corresponding to the bending area BA. The first conductive layer 520 may be on the first organic layer 510.

In such an embodiment, the substrate 100 may include a flexible material, for example, a plastic material including an organic material. Therefore, when the substrate 100 is formed, a part of a portion corresponding to the bending area BA may be patterned to form the first organic layer 510.

The first organic layer 510 integrally formed with the substrate 100 may have the plurality of first ridges 510b with the plurality of first openings 510a, i.e., a plurality of grooves may be provided between the plurality of first ridges 510b. The first conductive layer 520 on the first organic layer 510 may be arranged along the curvature of the first organic layer 510.

Figure 6:
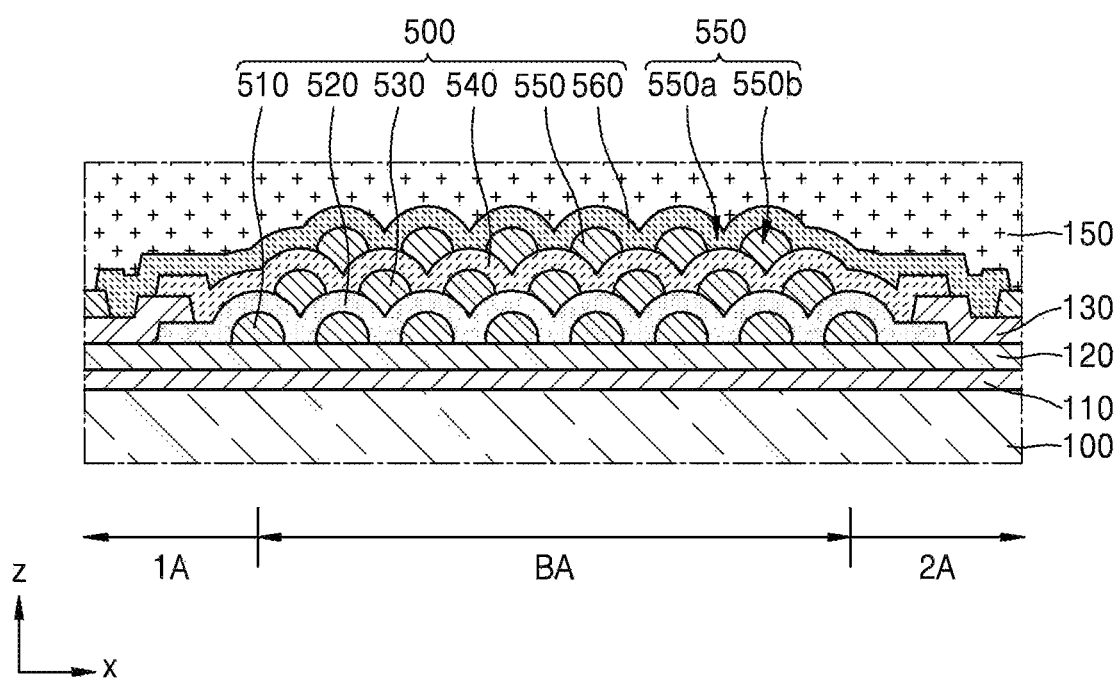
FIG. 6 is a cross-sectional view of a portion of a display device according to another alternative exemplary embodiment.

FIG. 6 is a cross-sectional view of a portion of a display device according to another exemplary embodiment.

The display device shown in FIG. 6 is substantially the same as the display device shown in FIG. 3 except for the wiring portion 500 on the bending area BA. The same or like elements shown in FIG. 6 have been labeled with the same reference characters as used above to describe the exemplary embodiments of the display device shown in FIG. 3, and any repetitive detailed description thereof will hereinafter be omitted or simplified.

Referring to FIG. 6, an exemplary embodiment of the display device may include the wiring portion 500 including a portion of the first organic layer 510 corresponding to the bending area BA and with the plurality of first openings 510a, the first conductive layer 520 on the portion of the first organic layer 510, the second organic layer 530 with the plurality of second openings 530a, the second conductive layer 540 on the second organic layer 530, a third organic layer 550 with a plurality of third openings 550a, and a third conductive layer 560 on the third organic layer 550. In such an embodiment, the first organic layer 510 is on the gate insulating film 120, but not being limited thereto. Alternatively, as shown in FIG. 4, the first organic layer 510 may be on the open portion from which an inorganic film is removed.

In an exemplary embodiment, as shown in FIG. 6, the third organic layer 550 may be on the second conductive layer 540. The plurality of third openings 550a is defined in the third organic layer 550, and the plurality of third openings 550a may extend in the first direction (or the +y direction) which is the same as a direction of the bending axis BAX. The plurality of third openings 550a may form a plurality of third ridges 550b. The plurality of second openings 530a is defined in the second organic layer 530 as in the exemplary embodiments described above. In such an embodiment, the plurality of third openings 550a and the plurality of second openings 530a may be alternately disposed with each other when viewed from a plan view in the +z direction.

Referring to FIG. 6, each of the plurality of third openings 550a may be on the plurality of second ridges 530b of the second organic layer 30. The second conductive layer 540 may be arranged along a curvature of the second organic layer 530 as the second conductive layer 540 is on the second organic layer 530. Accordingly, in such an embodiment, the plurality of third ridges 550b of the third organic layer 550 on the second conductive layer 540 are in grooves corresponding to the plurality of second openings 530a, such that the wiring portion 500 may have a compact structure.

In an exemplary embodiment, the third conductive layer 520 may be on a same layer as the gate electrode 213 or may include a same material as that of the gate electrode 213. The second conductive layer 540 may be on a same layer as the source electrode 215a and/or the drain electrode 215b, or may include a same material as that of the source electrode 215a and/or the drain electrode 215b. The third conductive layer 560 may include a same material as the pixel electrode 310. Accordingly, the pixel-defining layer 150 may extend over the third conductive layer 560 to cover the third conductive layer 560.

In an alternative exemplary embodiment, the third conductive layer 560 may include a conductive material layer on the source electrode 215a and/or the drain electrode 215b. The third conductive layer 560 may include metal wirings the same as metal wirings included in a touch portion (not shown) on the opposite electrode 330 or the display device 300 in addition to the pixel electrode 310. Although not shown, the wiring portion 500 arranged corresponding to the bending area BA may have a multi-layer structure by further including organic layers or conductive layers, if desired, without adding a process as described above.

In an exemplary embodiment, as shown in FIG. 6, the first conductive layer 520 and the second conductive layer 540 may be electrically connected to each other through the plurality of second openings 530a, and the second conductive layer 540 may be electrically connected to the third conductive layer 560 through the plurality of third openings 550a. Accordingly, in such an embodiment, the first conductive layer 520, the second conductive layer 540 and the third conductive layer 560 may be electrically connected to one another, and may collectively define one wiring for transmitting a same signal.

Figure 7:
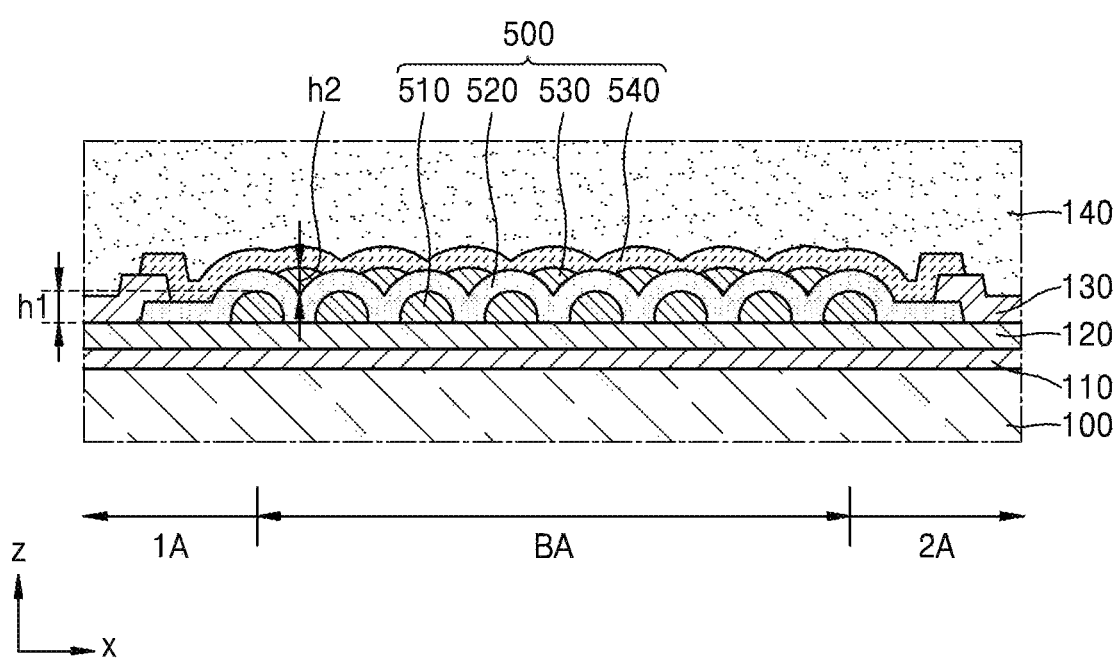
FIG. 7 is a cross-sectional view of a portion of a display device according to another alternative exemplary embodiment.

FIG. 7 is a cross-sectional view of a portion of a display device according to another exemplary embodiment.

The exemplary embodiment of FIG. 7 is substantially the same as the display device shown in FIG. 3 except for the wiring portion 500 on the bending area BA. The same or like elements shown in FIG. 7 have been labeled with the same reference characters as used above to describe the exemplary embodiments of the display device shown in FIG. 3, and any repetitive detailed description thereof will hereinafter be omitted or simplified.

Referring to FIG. 7, an exemplary embodiment of the display device may include the wiring portion 500 including a portion of the first organic layer 510 corresponding to the bending area BA and with the plurality of first openings 510a, the first conductive layer 520 on the portion of the first organic layer 510, the second organic layer 530 with the plurality of second openings 530a, and the second conductive layer 540 on the second organic layer 530. In such an embodiment, as shown in FIG. 7, the first organic layer 510 is on the gate insulating film 120, but not being limited thereto. Alternatively, as shown in FIG. 4, the first organic layer 510 may be on an open portion from which the inorganic film is removed.

According to an exemplary embodiment, as shown in FIG. 7, the first organic layer 510 may have a first height h1 and the second organic layer 530 may have a second height h2 that is less than the first height h1. A height of an organic layer may be a thickness of the organic layer. In such an embodiment, the first height h1 of the first organic layer 510 may be defined as a height of the top of the first ridges 510b of the first organic layer 510 with respect to a lower surface of the first organic layer 510. In such an embodiment, the second height h2 of the second organic layer 530 may be defined as a height of the top of the second ridges 530b of the second organic layer 530 with respect to grooves of the first organic layer 510.

In such an embodiment, the plurality of first openings 510a may be defined in the first organic layer 510, and the first ridges 510b may be located between the plurality of first openings 510a. In such an embodiment, the plurality of second openings 530a may be defined in the second organic layer 530, and the second ridges 530b may be located between the plurality of second openings 530a. An upper surface of the plurality of first ridges 510b and the plurality of second ridges 530b may be curved. In such an embodiment, the second height h2 of the second organic layer 530 is less than the first height h1 of the first organic layer 510, such that a curvature of the upper surface of the second ridges 530b may be less than a curvature of the upper surface of the plurality of first ridges 510b. Therefore, in such an embodiment the second conductive layer 540 arranged along a curvature of the second organic layer 530 may be more planarized or flatten than the first conductive layer 520 arranged along a curvature of the first organic layer 510.

Figure 8:
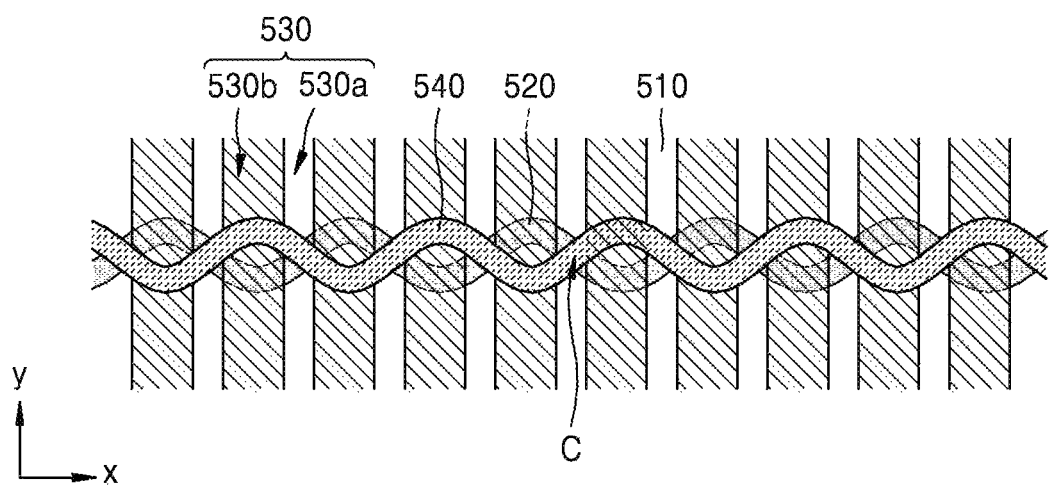
FIG. 8 is a plan view of a portion of a display device according to alternative another exemplary embodiment.
Figure 9:
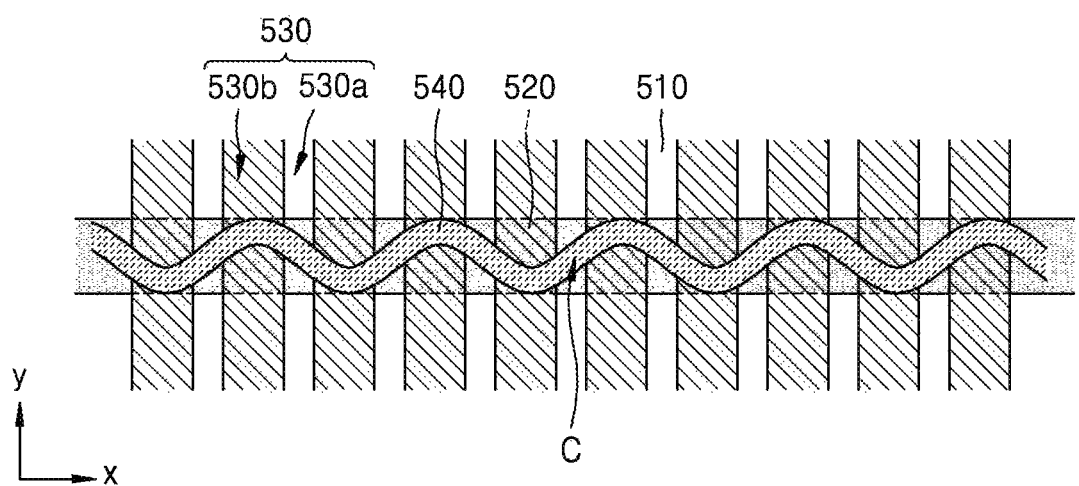
FIG. 9 is a plan view of a portion of a display device according to another alternative exemplary embodiment.

FIG. 8 is a plan view of a portion of a display device according to another exemplary embodiment, and FIG. 9 is a plan view of a portion of a display device according to another exemplary embodiment.

The display devices shown in FIGS. 8 and 9 is substantially the same as the display device shown in FIGS. 3 to 7 except for the wiring portion 500 on the bending area BA. The same or like elements shown in FIGS. 8 and 9 have been labeled with the same reference characters as used above to describe the exemplary embodiments of the display device shown in FIG. 3, and any repetitive detailed description thereof will hereinafter be omitted or simplified.

Referring to FIG. 8, an exemplary embodiment of the display device may include the wiring portion 500 including a portion of the first organic layer 510 corresponding to the bending area BA and with the plurality of first openings 510*a*, the first conductive layer 520 on the portion of the first organic layer 510, the second organic layer 530 with the plurality of second openings 530*a*, and the second conductive layer 540 on the second organic layer 530.

According to the present exemplary embodiment, a planar shape of the first conductive layer 520 and the second conductive layer 540 on the bending area BA may have a serpentine or wave-like shape. In such an embodiment, as shown in FIG. 8, the first conductive layer 520 and the second conductive layer 540 may each have a serpentine shape with a constant period on the bending area BA. In such an embodiment, when viewed from the plan view, the adjacent upper (or adjacent lower) portions of the first conductive layer 520 and the second conductive layer 540 may be spaced apart from each other by a distance corresponding to half of the period of the first conductive layer 520 and the second conductive layer 540.

The second organic layer 530 may be on the first conductive layer 520. The plurality of second openings 530*a* is defined in the second organic layer 530, and the second ridges 530*b* may be between the plurality of second openings 530*a*. At least a portion of the first organic layer 510 under the first conductive layer 520 may be exposed through the plurality of second openings 530*a*. In such an embodiment, the first conductive layer 520 is on the first organic layer 510, but the first conductive layer 520 does not cover the entire surface of the first organic layer 510. The first organic layer 510 may be exposed through the plurality of second openings 530*a* in an area where a portion of the first conductive layer 520 is not arranged.

The second conductive layer 540 may be on the second organic layer 530. The second conductive layer 540 may be in electrical contact with the first conductive layer 520 disposed below through the plurality of second openings 530*a*. In such an embodiment, the second conductive layer 540 may include a contact portion C contacting the first conductive layer 520 through the plurality of second openings 530*a*, and is electrically connected to the first conductive layer 520 through the contact portion C.

When at least a portion of the substrate 100, or the bending area BA of the substrate 100, is bent, a stress is concentrated on wirings on the bending area BA, such that defects such as cracking or disconnection may occur in the wirings.

In an exemplary embodiment of the display device, the wiring portion 500 on the bending area BA may reduce stress of the conductive layers 520 and 540 as a planar shape of the first conductive layer 520 and the second conductive layer 540 has the serpentine shape. However, in such an embodiment, a length of the wirings becomes longer, which may lead to a voltage drop. Therefore, in an exemplary embodiment of the display device, the first conductive layer 520 and the second conductive layer 540 may be electrically connected to each other through the plurality of second openings 530*a* to effectively prevent the voltage drop, such that the wiring portion 500 on the bending area BA may have a structure where cracking or disconnection is effectively prevented from being occurring.

In an alternative exemplary embodiment, as shown in FIG. 9, a planar shape of only the second conductive layer 540 may have the serpentine shape. In another alternative exemplary embodiment, the planar shape of only the first conductive layer 520 may have a serpentine shape, and the second conductive layer 540 may have a linear shape.

According to an exemplary embodiment of the disclosure as described herein, a display device may have long lifespan and minimized defect occurrence such as disconnection during a manufacturing process. However, the scope of the disclosure is not limited to the effect.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
    a substrate comprising a bending area at least partially bent around a bending axis extending in a first direction;
    a first organic layer on the substrate, wherein a plurality of first openings is defined in a portion of the first organic layer corresponding to the bending area;
    a first conductive layer on the portion of the first organic layer and covering at least a portion of the plurality of first openings;
    a second organic layer on the first conductive layer, wherein a plurality of second openings is defined in the second organic layer; and
    a second conductive layer on the second organic layer, covering at least a portion of the plurality of second openings, and electrically connected to the first conductive layer through the plurality of second openings.

2. The display device of claim 1, wherein the plurality of first openings extends in the first direction.

3. The display device of claim 1, wherein the plurality of second openings extends in the first direction.

4. The display device of claim 1, wherein the first conductive layer contacts at least a portion of the substrate through the plurality of first openings.

5. The display device of claim 1, further comprising:
    an inorganic film between the substrate and the first organic layer,
    wherein the first conductive layer contacts at least a portion of the inorganic film through the plurality of first openings.

6. The display device of claim 1, wherein the plurality of first openings and the plurality of second openings are alternately disposed with each other when viewed from a plan view in a thickness direction of the substrate.

7. The display device of claim 1, wherein
    a plurality of first ridges is defined between the plurality of first openings, and
    a plurality of second ridges is defined between the plurality of second openings.

8. The display device of claim 7, wherein the plurality of second ridges is on the plurality of first openings.

9. The display device of claim 1, wherein a planar shape of at least one of the first conductive layer and the second conductive layer in the bending area has a serpentine shape.

10. The display device of claim 1, further comprising:
a display device on the substrate,
wherein
the substrate further comprises a first area and a second area, which are opposite to each other with respect to the bending area, and
the display device is on the first area.

11. The display device of claim 1, wherein the first organic layer and the substrate are integrally formed as a single unitary and indivisible unit.

12. The display device of claim 1, further comprising:
a third organic layer on the second conductive layer, wherein a plurality of third openings is defined in the third organic layer; and
a third conductive layer on the third organic layer and electrically connected to the second conductive layer through the plurality of third openings.

13. The display device of claim 12, wherein the plurality of third openings extends in the first direction.

14. The display device of claim 12, wherein the plurality of second openings and the plurality of third openings are alternately disposed with each other when viewed from a plan view in a thickness direction of the substrate.

15. The display device of claim 12, wherein
a plurality of third ridges is defined between the plurality of third openings, and
the plurality of third ridges is arranged on the plurality of second openings.

16. The display device of claim 12, wherein the first conductive layer, the second conductive layer and the third conductive layer are electrically connected to one another.

17. The display device of claim 1, wherein
the first organic layer has a first height, and
the second organic layer has a second height less than the first height.

18. The display device of claim 1, wherein at least a portion of the first conductive layer is exposed through the plurality of second openings.

19. A display device comprising:
a substrate comprising a first area, a second area spaced apart from the first area, and a bending area between the first area and the second area, wherein the bending area is bent around a bending axis extending in a first direction;
a display device on the first area of the substrate; and
a wiring portion on the bending area of the substrate,
wherein the wiring portion comprises:
a first organic layer on the substrate, wherein the first organic layer comprises a plurality of first ridges spaced apart from each other with a first interval and extending in the first direction;
a first conductive layer on the first organic layer;
a second organic layer on the first conductive layer, wherein the second organic layer comprises a plurality of second ridges spaced apart from each other with a second interval and extending in the first direction; and
a second conductive layer on the second organic layer and electrically connected to the first conductive layer through the second interval between the plurality of second ridges of the second organic layer.

20. The display device of claim 19, wherein a planar shape of at least one of the first conductive layer and the second conductive layer on the bending area has a serpentine shape.

* * * * *